United States Patent [19]
Battersby

[11] Patent Number: 5,742,044
[45] Date of Patent: Apr. 21, 1998

[54] LIGHT SENSING ARRAY DEVICE AND APPARATUS INCORPORATING SUCH

[75] Inventor: Stephen J. Battersby, Haywards Heath, England

[73] Assignee: U.S. Philips Corporation, New York, N.Y.

[21] Appl. No.: 754,347

[22] Filed: Nov. 22, 1996

[30]  Foreign Application Priority Data

Nov. 30, 1995 [GB] United Kingdom ............... 9524483.6

[51] Int. Cl.⁶ .................................................. H01J 40/14
[52] U.S. Cl. ................................ 250/208.1; 250/214 R; 348/308
[58] Field of Search ........................ 250/208.1, 208.2, 250/214.1, 214 R; 348/308, 302, 307, 281; 257/444, 443

[56]  References Cited

U.S. PATENT DOCUMENTS 4,644,406  2/1987  Nishigaki et al. .

5,371,351  12/1994  Van Berkel ............................ 250/208.1

FOREIGN PATENT DOCUMENTS

0608932A2  8/1994  European Pat. Off. .
0633542A2  1/1995  European Pat. Off. .

*Primary Examiner*—Que Le
*Attorney, Agent, or Firm*—Brian J. Wieghaus; Anne E. Barschall

[57]  ABSTRACT

A light sensing array device including an array of photo-electric light sensing elements (10) individually addressable via sets of address conductors (12, 14) for use, for example, in image sensing or data input using a light pen, which is operable also in a power generating mode in which sensing elements in the array produce electrical power in the manner of a solar cell. To this end, the sets of address conductors are selectively connected via switching means (20, 21, 37, 38) to power output terminals (42, 43). The generated power may be used to supplement a power supply, e.g. using a battery pack, of the device or of electronic apparatus, such as a notebook computer, incorporating the device.

6 Claims, 3 Drawing Sheets

LIGHT SENSING ARRAY DEVICE AND APPARATUS INCORPORATING SUCH

BACKGROUND OF THE INVENTION

This invention relates to a light sensing array device comprising an array of photoelectric sensing elements for sensing incident light, the sensing elements being arranged in rows and columns and addressed via sets of row and column address conductors, each sensing element being connected between a respective row conductor and a respective column conductor, and a drive circuit connected to the sets of row and column address conductors for addressing the sensing elements and providing an output according to photoconduction in the individual sensing elements resulting from light incident thereon. The invention relates also to equipment incorporating such a light sensing array device.

An example of a light sensing array device of the above kind and comprising an image sensing device is described in U.S. Pat. No. 4,644,406. The device is used for contact image sensing in which an image on a document is read by placing the document directly over the array and comprises crossing sets of row and column conductors carried on an insulating support with a layer of hydrogenated amorphous silicon material having a p-i-n structure separating the sets of conductors at least at their cross-over regions whereby a p-i-n photodiode connected between respective ones of the row and column conductors, and constituting a light sensing photoelectric element, is obtained at each cross-over region. The row and column conductors are connected respectively to row and column scan drive circuits for reading the sensing elements. The column scan drive circuit comprises a series of switches, each connected to a respective column conductor, which are operated in succession by means of a shift register circuit to connect each of the column conductors in turn to a predetermined potential. The row scan drive circuit selects each row conductor in turn and similarly comprises a series of switches connected to respective row conductors which are operated in succession by a shift register circuit to couple each row conductor in turn to a sensing circuit whereby the sensing elements in a selected row are reverse biased and read by sensing an output photo-current from each sensing element in the row as it is scanned by the column drive circuit, the output current from the individual sensing elements being dependent on the amount of illumination falling on the element. Each row of sensing elements in the array is read in this manner in sequence so as to provide an output indicative of all sensing elements in the array.

Due to their solid-state nature such light sensing array devices are comparatively compact and robust and as their power requirements are small they are ideally suited to portable applications. The light sensing array devices could, for example, be combined with liquid crystal display panels in portable equipment such as personal computers, PDAs, and electronic notebooks so as to provide, in addition to a basic display function, an image reading function or a data input function in which a light pen is used in conjunction with the light sensing array device.

SUMMARY OF THE INVENTION

It is an object of the present invention to provide an improved light sensing array device suitable for such purposes.

According to one aspect of the present invention, there is provided a light sensing array device of the kind described in the opening paragraph which is characterised in that the device includes first and second terminals for an electrical power output from the array and switching means selectively operable to connect electrically at least some of the row address conductors and the column address conductors respectively to the first output terminal and the second output terminal with the photoelectric sensing elements connected therebetween being operable in a photovoltaic mode so as to generate an electrical power output at the said first and second terminals in response to the illumination thereof. In addition, therefore, to its primary function of, for example, imaging or light pen input sensing, the sensing array device is thus able to provide also an electrical power generating function, through the sensing elements operating in the manner of solar cells, during periods when the sensing elements are not being addressed by the drive circuit for image or pen input sensing purposes. The invention stems from a recognition that the sensing elements employed in such devices can be used to considerable advantage to provide this further function in a relatively simple and convenient manner with only minor modifications being required to the circuit of the device. Conventionally in light sensing array devices, the sensing elements are utilised to perform the sole function of detecting a light input using their photoconductive characteristic in conjunction with operating voltages applied to the sensing element. Consequently, such devices merely consume electrical power. The additional functionality provided by utilising at least some of the sensing elements of the array in the separate role of photovoltaic elements to generate electrical power offers considerable benefits, particularly when the device is used, for example, in portable equipment such as a notebook computer, PDA, or the like using a battery pack as a power source. The power generated can then be used beneficially to supplement the battery pack.

According to another aspect of the present invention, therefore, there is provided electronic apparatus comprising a light sensing array device in accordance with the first aspect of the present invention and electrical power storage means for powering components of the apparatus to which the generated electrical power is supplied from the first and second output terminals of the device. The power storage means, for example, a battery pack, may be that used to power the light sensing array device alone where the apparatus comprises, for example, a portable document reader, graphics tablet, or the like, or that used to power other components in the case where the light sensing array device is incorporated in equipment such as a notebook computer or a PDA. The power generated can be used to recharge the battery pack so as to extend its operational duration.

With the photovoltaic mode selected by operation of the switching means, the sensing device functions, in the manner of a solar cell, to convert incident illumination, for example, ambient light, into electrical power. Switching of the device to this mode may be controlled either manually by a user or automatically during periods when the device is not being used for image or pen input sensing purposes. When the row and column address conductors are connected to the first and second terminals respectively, the sensing elements associated therewith are connected together electrically in parallel between the terminals, thus constituting a large area solar cell. Preferably, in order to maximise power output, at least most of the sensing elements in the array are utilised for power generation, by connection of the associated rows and columns address conductors to the first and second terminals.

The sensing elements preferably comprise photo diodes, and particularly n-i-p photodiodes, although other diode structures such as p-i-n diodes, p-n junction diodes and metal-semiconductor diodes (Schottkey barrier) and other known kinds of photoelectric elements that are capable of being operated in both a photovoltaic mode and a photoconductive mode could be used. In a preferred embodiment, amorphous silicon n-i-p diodes are used.

Because the photoelectric sensing elements normally would be constructed and designed such that their operational characteristics are tailored primarily for optimum performance in image reading or light pen input detection in particular, it can be expected that their efficiency in generating electrical current will be less than that of a dedicated solar cell of corresponding dimensions and specifically constructed to enhance the capability of generating electric current by optimising its quantum efficiency and spectral response characteristic over a broad solar wavelength range. Photodiodes, for example, used as light sensing elements in sensing array devices on the other hand are typically designed to operate with a narrow wavelength range centred on the optical input signal wavelength, for example, the wavelength range of light from a light pen or the wavelength range of light used for document reading which need not necessarily be ambient light. Even so, such photodiodes are capable of generating an adequate and useful electrical current output under normal ambient illumination situations.

The sensing elements may each comprise a plurality of photodiodes connected in series. In this way the output voltage obtained at the first and second terminals from the parallel connected sensing elements utilised for power generation can be increased proportionately. By using two or three series photodiodes in each sensing element the output voltage will be approximately doubled or trebled. However, increasing the number of photodiodes in each sensing element will affect the physical dimensions of the sensing element and consequently the resolution attainable.

Although the sensing elements may comprise simply one, or more, photodiodes connected between a row address conductor and a column address conductor, the invention may be applied also to light sensing array devices of the active matrix type in which each sensing element further includes a switching device. For example, the sensing element array could be of the kind described in EP-A-0608 932 or EP-A-0633 542 in which the sensing elements each comprise a photodiode and a blocking diode connected in series back to back, with their anodes for example connected together and with their cathodes connected respectively to a row address conductor and a column address conductor. It is envisaged also that the invention may be applied to a light sensing element array of the kind in which the switching element comprises a transistor, typically a thin film transistor (TFT). With such an array it would be necessary to turn on the TFTs of the sensing elements by means of gating signals applied to the TFTs, under the control of the switching means for example, so as to establish the necessary connection paths between the photodiodes and row and column address conductors for the duration of the power generation mode period. The electrical power requirements for gating the TFTs to this end would be insignificant.

BRIEF DESCRIPTION OF THE DRAWING

Embodiments of a light sensing array device, and electronic apparatus incorporating such, in accordance with the present invention will now be described, by way of example, with reference to the accompanying drawings, in which.

It should be understood that the Figures are merely schematic and are not drawn to scale. The same reference numerals are used throughout the Figures to denote the same or similar parts.

DESCRIPTION OF THE PREFERRED EMBODIMENTS

Figure 1:
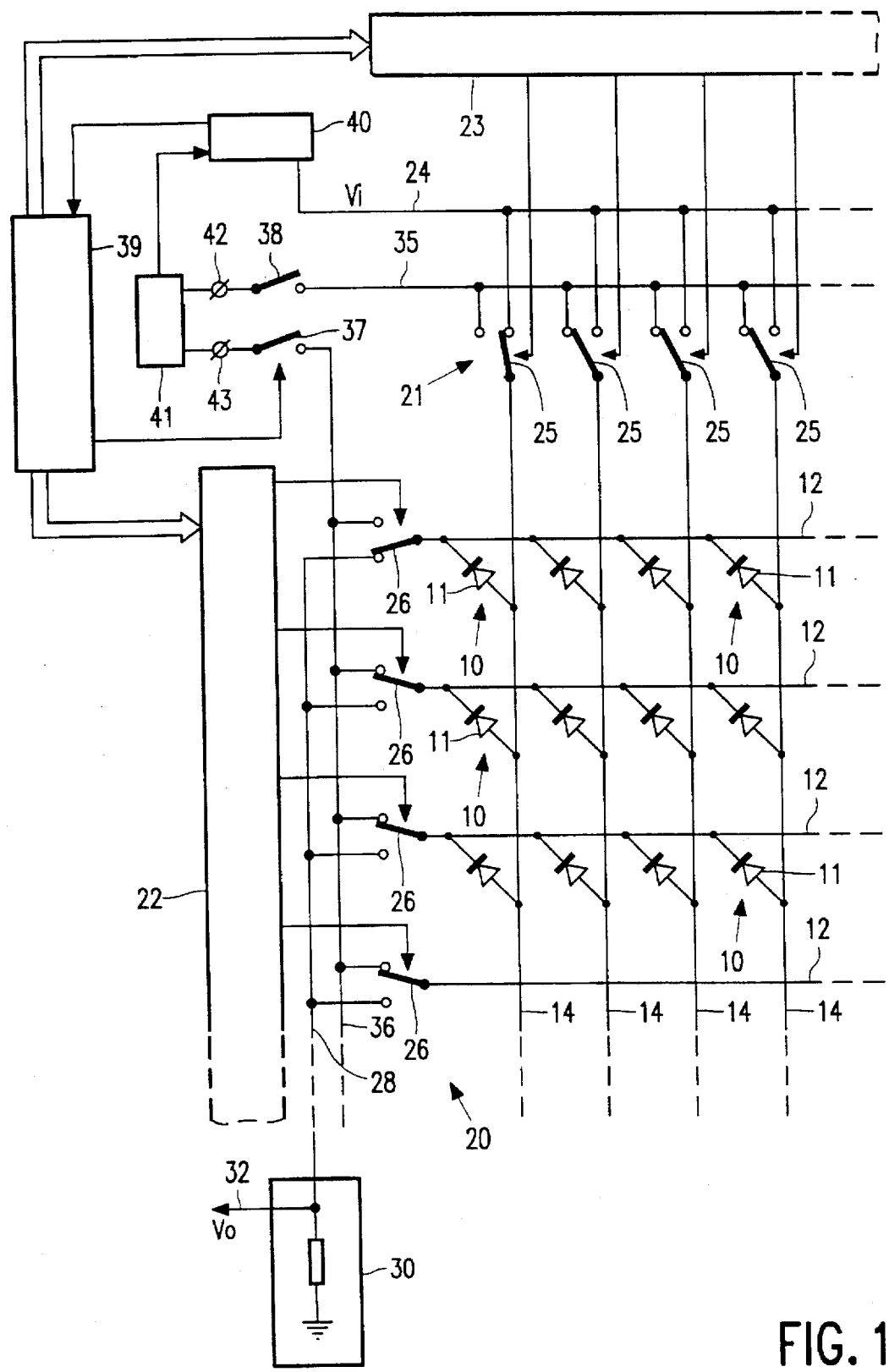
FIG. 1 is a schematic circuit diagram of an embodiment of light sensing array device according to the invention.

Referring to FIG. 1, the light sensing array device comprises a two dimensional matrix of light sensing elements 10 defining a coordinate system of rows and columns of light sensing locations. In this embodiment each light sensing element 10 comprises a photodiode 11 and in particular an amorphous silicon photodiode. The array of sensing elements is addressed via sets of crossing row and column address conductors 12 and 14 with each sensing element being connected between a respective one of the row conductors 12 and a respective one of the column conductors 14 at their intersection so that all sensing elements in one row share the same row conductor and all sensing elements in one column share the same column conductor.

Figure 2:
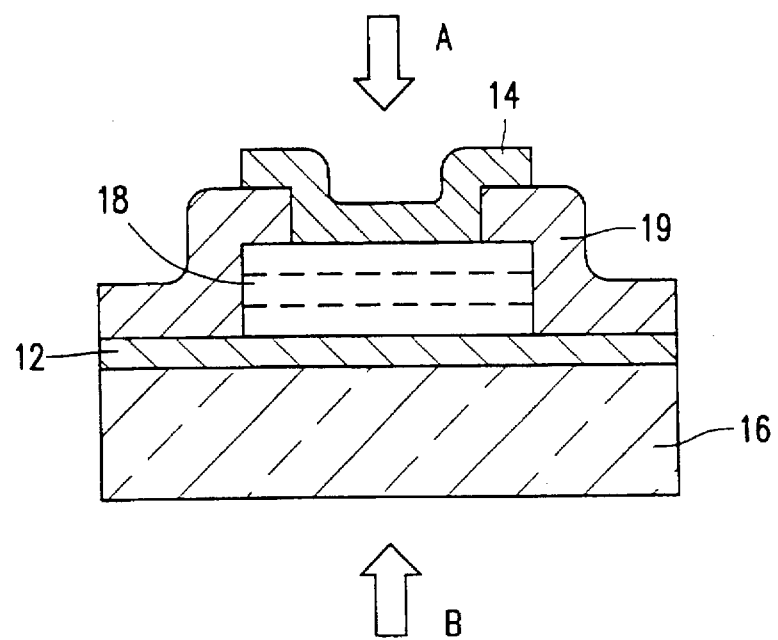
FIG. 2 is a schematic sectional view through a typical light sensing element in the array of the device of FIG. 1.

A typical sensing element 10 of the array is illustrated in cross-section in FIG. 2. The array of sensing elements, together with the sets of address conductors, are fabricated on a transparent, insulating, support 16, for example of glass, using conventional thin film technology by depositing and processing thin film layers. The manner of fabrication and the kind of structure produced can be varied, as will be apparent to persons skilled in the art, and it will be appreciated that the simple structure shown in FIG. 2 is by way of example only. Briefly, such a structure is fabricated by firstly depositing on the surface of the support 16 a thin layer of electrical conductive material and patterning this layer photolithographically to define a planar set of spaced, parallel, strips constituting the row conductors 12. Hydrogenated amorphous silicon material is then deposited using a plasma enhanced CVD process to produce a semiconductor layer having a n-i-p structure 18, in which the n layer is adjacent the conductors 12, and which is then defined to leave discrete portions in a row and column array, each portion overlying a respective portion of a row conductor 12. Thereafter a thin film layer 19 of passivating, electrically-insulating, material, such as silicon nitride, is deposited completely over the support and photolithographically patterned to open a window through this layer over each n-i-p layer portion 18. A further layer of electrically conductive material is then deposited and patterned to leave a set of spaced parallel strips constituting the column conductors 14 with each conductor 14 extending over a column of the semiconductor layer portions 18 and contacting the upper, p, layer of the layer portions 18. Thus, crossing sets of row and column conductors, 12 and 14, are obtained with photodiodes 11, comprising the n-i-p layer structures, connected electrically therebetween at each of their intersections.

The dimensions of the photodiode elements 11 may typically be around 75 micrometers square and their pitch around 100 micrometers, although the dimensions and pitch can be varied depending on the intended use and required resolution of the array. Only a very small portion of the array is shown in FIG. 1. The overall dimensions of the array may, for example, correspond to the size of an A4 sheet of paper if the array is to be used for reading such documents in a contact image sensing manner. The conductive materials used for the row and column conductors can be various, although at least one of the conductors must be transparent, for example of ITO. If, for example, an original to be read is placed over the array of elements 10 then the column conductors would be of transparent material and the row conductors can be of metal. In operation, the original could be illuminated from above, as indicated by the array A, assuming the document is adequately translucent to allow light to pass through the document, or from below as indicated by the arrow B, with light being directed through the support 16 and reflected from localised regions of the surface of the document onto a sensing element in close proximity thereto. In the latter case, the row conductors are preferably of opaque material to act as light shields or, alternatively, separate light shielding layers could be provided.

The construction of the array and its operation is similar in many respects to the image reading device described in U.S. Pat. No. 4,644,406 to which reference is invited for further details and whose disclosure is incorporated herein by reference.

The light sensing array device could be used for data input purposes in the manner, for example, of a graphics tablet, rather than or as well as an image sensing array, and used in conjunction with a light pen that is moved by a sensor over the array. A light beam emitted by the pen is detected by individual sensing elements as the beam passes over the elements.

Referring again to FIG. 1, an X-Y addressing scheme is used to read the array of sensing elements. To this end, the sets of row and column conductors are connected to a drive circuit comprising respective switching arrangements 20 and 21 whose operations are controlled by shift register circuits 22 and 23. Each column conductor 14 is connected to an associated switch 25 in the switching arrangement 21 and each of the switches 25 is operated by the shift register circuit 23 in succession during a row scan period to supply a predetermined voltage, Vi, of around, for example, −2 or −3 volts, provided on a common line 24 by a power supply unit 40, to each column conductor 14 in turn. Similarly, each row conductor 12 is connected to an associated switch 26 of the switching arrangement 20 whose operation is controlled by the shift register circuit 22 such that each of the switches 26 is operated in succession to couple each row conductor 12 in turn to a common line 28 for the duration of a row scan period. The line 28 in turn is connected to a sense circuit 30 which produces a voltage output, Vo, that is a measure of the current flowing in the line 28. With this addressing scheme, the sensing elements in one row are read in sequence by operation of the switches 25 to apply the voltage Vi to each column conductor in turn with the process being repeated for successive rows of elements by operation of the switches 26. When an element 10 is selected by closure of one of the switches 26, the voltage Vi is applied to one side of the photodiode 11 and the level of electrical current which then flows along the line 28 is dependent on the extent of photoconduction in the photodiode which, in turn, is determined by the level of illumination falling on the photodiode. Consequently a voltage indicative of the illumination, or non-illumination, is derived at the output 32. Through scanning in this manner, an output signal comprising a series of voltages is obtained at the output 32 as the individual sensing elements in a row are scanned and read. After all the rows of sensing elements have been read in one field period, corresponding approximately to a row scan period times the number of rows, an output signal is obtained at 32 indicative of the level of light incident on each of the elements in the array, which, if being used for image sensing, represents electronically the sensed image. In the case particularly of the device being used with a light pen input, the array would be similarly addressed again in successive field periods to provide information indicative of movement of the pen over the array.

The operation of the shift registers 22 and 23 controlling the switch arrangements 20 and 21 is synchronised by a timing and control circuit 39. Electrical power for the circuits 39, 22 and 23 and the voltage Vi are provided by a power supply unit 40. In this particular example, the device is intended to be used as a stand-alone, portable unit and to this end the power supply comprises a rechargeable battery pack. In use, the signal obtained from the output 32 would be supplied to a computer system.

FIG. 1 shows the operation of the switching arrangements 20 and 21 to select the sensing element at the intersection of the first row conductor and the first column conductor. During the reading operation the non-selected row conductors 12 and the non-selected column conductors 14 are connected via their associated switches 25 and 26 to common lines 35 and 36 respectively so as to couple electrically each of the unselected row conductors 12 together and each of the non-selected column conductors 14 together.

As also shown in FIG. 1, the lines 35 and 36 are connected through switches 38 and 37 respectively to first and second output terminals 42 and 43 to which an output impedance, here represented simply by the block 41, is connected. During periods when image or light pen input sensing function is not being utilised, the sensing array device can be switched so as to be operable in a power generating mode in which the sensing elements generate electrical power that is supplied to the output terminals 42 and 43. The means by which this is achieved is constituted by the switching arrangements 20 and 21 together with the switches 37 and 38 which are selectively operable, under the control of the circuit 39, to connect row and column conductors to the terminals 42 and 43. Selection of this mode may be in response to a manual input by a user to the unit 39 or automatically by the unit 39 during intervals between image or pen input functions being performed. In the power generating mode of operation, the switches 38 and 37 are closed under the control of the circuit 39 with the switches 25 and 26, appropriately set by the circuits 22 and 23, connecting at least some of the row conductors 12 and at least some of the column conductors 14 to the lines 36 and 35 respectively. The photodiodes 11 of the array associated with those conductors are unbiased and operate then in a photovoltaic mode to convert light incident thereon into electrical energy and generate a voltage at the output terminals 42 and 43 in the manner of the solar cell. Preferably in this mode, the switches 26 are set to connect all, or at least most, of the row conductors 12, via the closed switch 37, to the terminal 43 and the switches 25 are set to connect all, or at least most, of the column conductors 14, via the closed switch 38, to the terminal 42. As is apparent from FIG. 1, the switching arrangements 20 and 21 are controlled by the circuits 22 and 23 such that at any given time all but one of the row conductors 12 and all but one of the column conductors 14 are connected to the lines 36 and 35. A simple modification is then only required to the circuits 22 and 23 such that, upon an appropriate input control signal from the control circuit 39, all row conductors and all column conductors are connected simultaneously via the switches 26 and 25 to the lines 36 and 35. The individual photodiodes 11 of the array are thus connected, via the switches 25 and 26, electrically in parallel with one another between the terminals 42 and 43, in effect constituting a large area solar cell whose active area is equivalent to their combined individual light receptive areas. Consequently, a useful electrical power output can be obtained in response to the array being flood illuminated, even though the photoelectric conversion efficiency may be less than that of a true solar cell. The circuits 22 and 23 may be arranged alternatively to connect only some of the row and column conductors 12 and 14 to the lines 36 and 35 in this mode, although in consequence a reduced amount of power would then be generated.

The electrical power obtained by operating the array in a photovoltaic mode in this way is used in this embodiment to supplement the rechargeable battery pack 40 and to this end the block 41 comprises a trickle charge power supply circuit for recharging the battery pack. The block 41 could alternatively comprise a separate power supply unit including is own rechargeable battery pack for use as a back-up power supply.

The light sensing array device need not be a stand-alone unit but may be used in equipment such as a portable computer or PDA to provide image sensing and/or light pen input functionality. In this case, the power generating capability of the device may be utilised effectively during periods of inactivity to supplement the equipment's power supply unit in the above described manner or to provide a back-up power supply, using a separate rechargeable battery pack, to maintain a supply of power on a selected basis only to critical components such as the system RAM.

Figure 3:
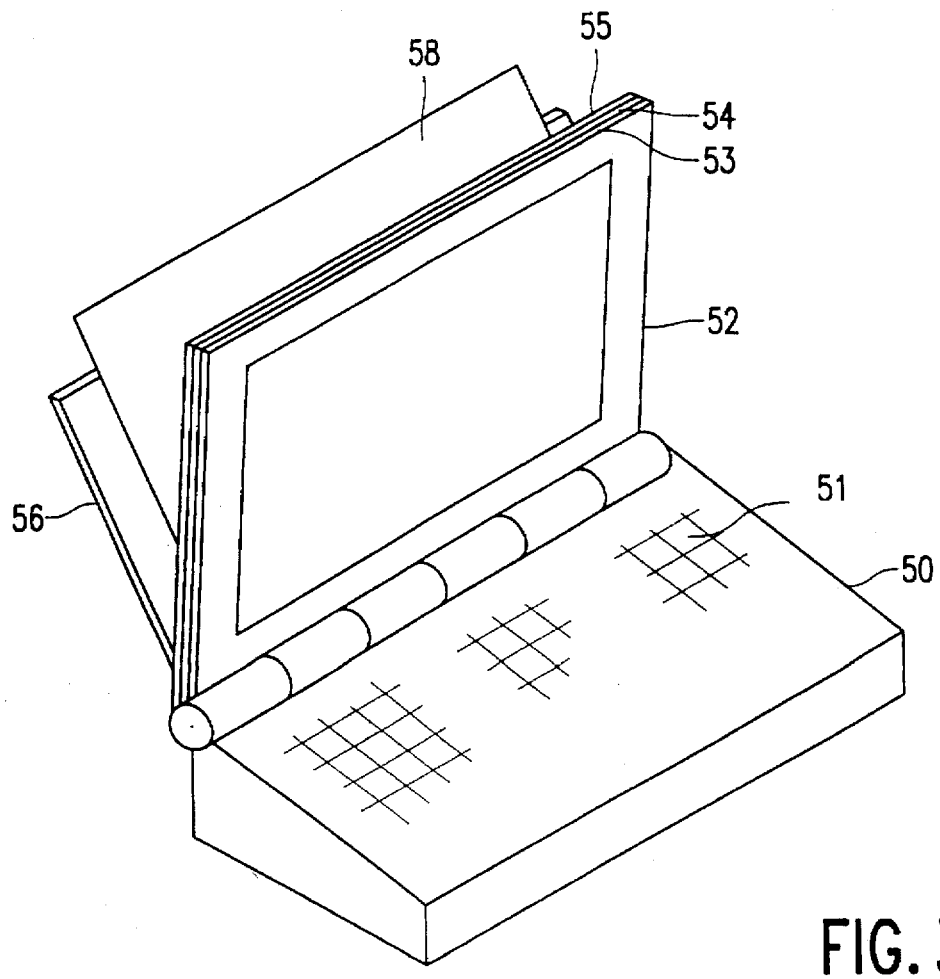
FIG. 3 illustrates schematically an example of electronic apparatus using the device of FIG. 1.

An example of such equipment, in the form of a notebook computer, is illustrated schematically in FIG. 3. The computer comprises a main housing 50 which supports a keyboard 51 and contains the primary computer system components such as the microprocessor, system RAM, hard disk drive, floppy disk drive, input/output interfaces, power supply unit, etc. Pivotally attached to the main housing is a unit 52 comprising, stacked together, an active matrix LC display panel 53 in combination with a backlight 54 and a 2-d light sensing array panel of the kind described with reference to FIGS. 1 and 2, here referenced 55, for use as an image sensor. Behind the unit 52, and also pivotally attached to the housing 50, there is a back plate 56. In order to read the image on a document, the original shown here at 58 is placed between the sensing array panel 55 and the backplate 56 and the backplate is pivoted with respect to the panel 55 to hold the original against the surface of the panel 55 during contact image sensing. The backlight 54 provides the necessary illumination, whilst also serving to provide illumination for the LC panel 53. During periods of inactivity, the unit 52 can be folded down over the keyboard leaving the photodiodes of the array in the panel 55 exposed to ambient light so as to generate electrical power which is utilised to charge the battery pack of the power supply. The control circuit 39 may be arranged so as to switch from the image input sensing mode to the power generating mode automatically in response to a predetermined period of inactivity of the apparatus or may be switched manually by an operator. During transportation, the backplate 56 can be folded down over the unit 52 to protect the panel 55. In an alternative arrangement, the light sensing panel 55 could be arranged at the front overlying the output side of the display panel 53 with the display from the panel 53 being viewed through the panel 55. An original to be read is then placed over the outer surface of the panel 55 and read using light from the backlight 54 transmitted through the display panel 53. With such an arrangement information can be written into the sensing panel 55 using a light pen with the sensed information being used to control the display panel 53 to produce a display output corresponding to the path of travel of the light pen to give the appearance of writing on paper. Rather than comprising two separately fabricated panels, the LC display panel 53 and the light sensing panel 55 could be integrated in one panel, as known in the art.

Figure 4:
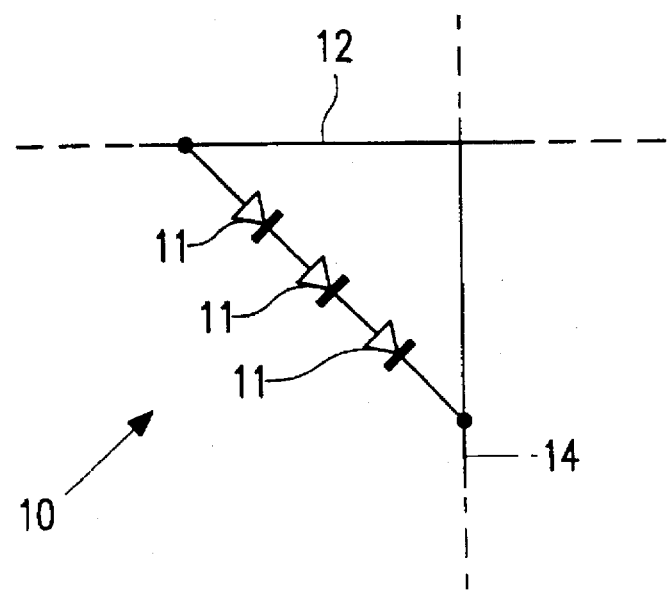
FIGS. 4 and 5 illustrate examples of alternative forms of sensing elements circuits which may be used in the sensing element array.
Figure 5:
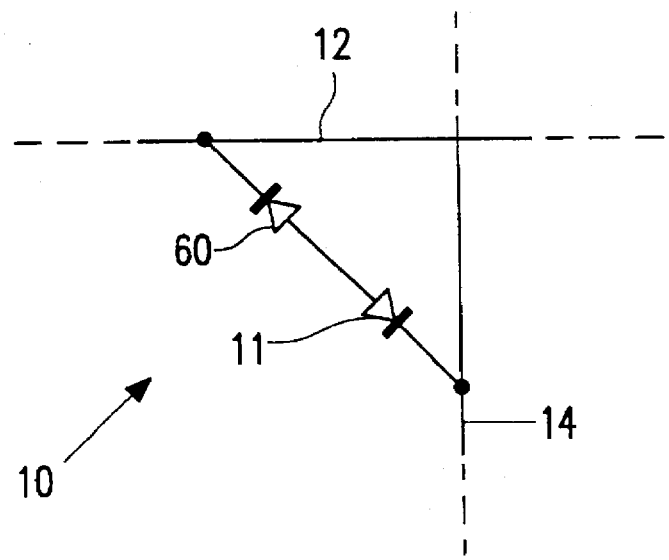

In the above described embodiment, a very simple sensing element array is used, each element comprising a single photodiode connected between respective row and column address conductors. Various alternative forms of sensing elements are possible. For example, each sensing element may comprise a plurality of photodiodes connected electrically in series. Each sensing element could comprise two or three, or more, photodiodes in series. FIG. 4 illustrates the circuit of a typical sensing element of an array in the case where each sensing element comprises three series-connected photodiodes. The use of series-connected photodiodes results in an increase in the voltage obtained at the terminals 42 and 43 in the power generation mode of operation. Assuming, for example, that the single photodiode 11 in the device of FIG. 1 produces around, say, 300 millivolts when illuminated, then by using two or three such photodiodes in series at each fusing element, the voltage produced will instead be close to 600 and 900 millivolts respectively. Moreover, the sensing element array could be if the active matrix type in which each sensing element includes a switching element. For example, the sensing element array may be of the kind described in EP-A-0608932. FIG. 5 shows the circuit of a typical sensing element in an example of such an array. In this example each sensing element comprises a photodiode 11 and a switching diode 60 connected in series back to back, with their anodes connected together. The voltage produced by a sensing element, and thus the voltage produced at the terminals 42 and 43, with the photodiode operating as a photovoltaic device in the power generating mode will be less than that produced by the sensing elements in the device of FIG. 1 due to a voltage drop across the diode 50. Again, a plurality of photodiodes 11 connected in series could be used.

Thus, a light sensing element array has been described comprising an array of photoelectric light sensing elements individually addressable via sets of address conductors for use, for example, in image sensing or data input using a light pen, which is operable also in a power generating mode in which sensing elements in the array produce electrical power in the manner of a solar cell. To this end, the sets of address conductors are selectively connected via switching means to power output terminals. The generated power may be used to supplement a power supply, e.g. using a battery pack, of the device or of electronic apparatus, such as a notebook computer, incorporating the device.

From reading the present disclosure, other modifications will be apparent to persons skilled in the art. Such modifications may involve other features which are already known in the field of light sensing array devices and component parts thereof and which may be used instead of or in addition to features already described herein.

I claim:

1. A light sensing array device comprising an array of photoelectric light sensing elements for sensing incident light, the sensing elements being arranged in rows and columns and addressed via sets of row and column address conductors, each sensing element being connected between a respective row conductor and a respective column conductor, and a drive circuit connected to the sets of row and column address conductors for addressing the sensing elements and providing an output according to photoconduction in the individual sensing elements resulting from light incident thereon, characterised in that the device includes first and second terminals for an electrical power output from the array and switching means selectively operable to electrically connect at least some of the row address conductors and the column address conductors respectively to the first output terminal and the second output terminal with the photoelectric sensing elements connected therebetween being operable in a photovoltaic mode so as to generate an electrical power output at the said first and second terminals in response to the illumination thereof.

2. A light sensing array device according to claim 1, characterised in that the photoelectric elements comprise photodiodes.

3. A light sensing array device according to claim 2, characterised in that the photodiodes comprise amorphous silicon photodiodes.

4. A light sensing array device according to claim 2, characterised in that each sensing element comprises a plurality of photodiodes connected in series.

5. A light sensing array device according to claim 2, characterised in that each sensing element further includes a switching device.

6. Electronic apparatus including a light sensing array device according to claim 1 and electrical power storage means for powering components of the apparatus to which the generated power is supplied from the first and second power output terminals of the device.

* * * * *